United States Patent [19]
Brown

[11] Patent Number: 5,410,250
[45] Date of Patent: Apr. 25, 1995

[54] MAGNETIC RESONANCE IMAGING COLOR COMPOSITES

[75] Inventor: Hugh K. Brown, Temple Terrace, Fla.

[73] Assignee: University of South Florida, Tampa, Fla.

[21] Appl. No.: 128,355

[22] Filed: Sep. 28, 1993

Related U.S. Application Data

[62] Division of Ser. No. 871,406, Apr. 21, 1992.

[51] Int. Cl.$^6$ ............................................... G01V 3/00
[52] U.S. Cl. ...................................... 324/309; 382/16
[58] Field of Search ................................ 324/309, 307; 128/653.2; 382/16, 17, 18, 25; 358/81

[56] References Cited

U.S. PATENT DOCUMENTS

| | | | |
|---|---|---|---|
| 4,694,250 | 9/1987 | Iwaoka et al. | 324/309 |
| 4,789,831 | 12/1988 | Mayo, Jr. | 324/309 |
| 4,941,192 | 7/1990 | Mishima et al. | 382/18 |

*Primary Examiner*—Louis Arana
*Attorney, Agent, or Firm*—Reising, Ethington, Barnard, Perry & Milton

[57] ABSTRACT

The invention relates to an apparatus and method for producing a single color coded composite image from a plurality of multiparameter magnetic resonance image sets. The plurality of magnetic resonance image sets are spatially aligned and are acquired using different pulse sequences to contrast various parameters of anatomical, physiological and pathological features. The method includes acquiring the gray-tone images, and plotting a histogram of the average pixel signal intensities for selected regions of interest in each image. This provide quantitative data to support qualitative assessments of tissue contrast behavior in each of the images which acts as a basis for color coding. Based on the histogram, color coefficients of red, green and blue channels are assigned to each image so that the final combination of colors will produce a semi-natural appearing composite image. Monochrome images are created based on the gray-tone images and color coefficiency tables. The monochrome images are combined to produce the composite image.

8 Claims, 15 Drawing Sheets

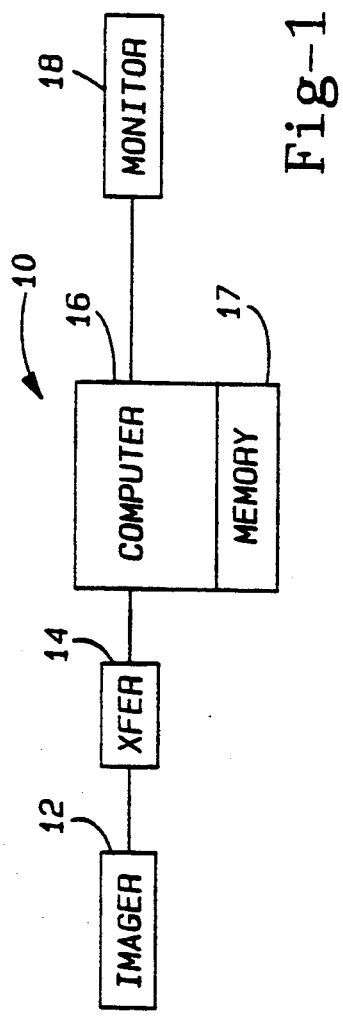
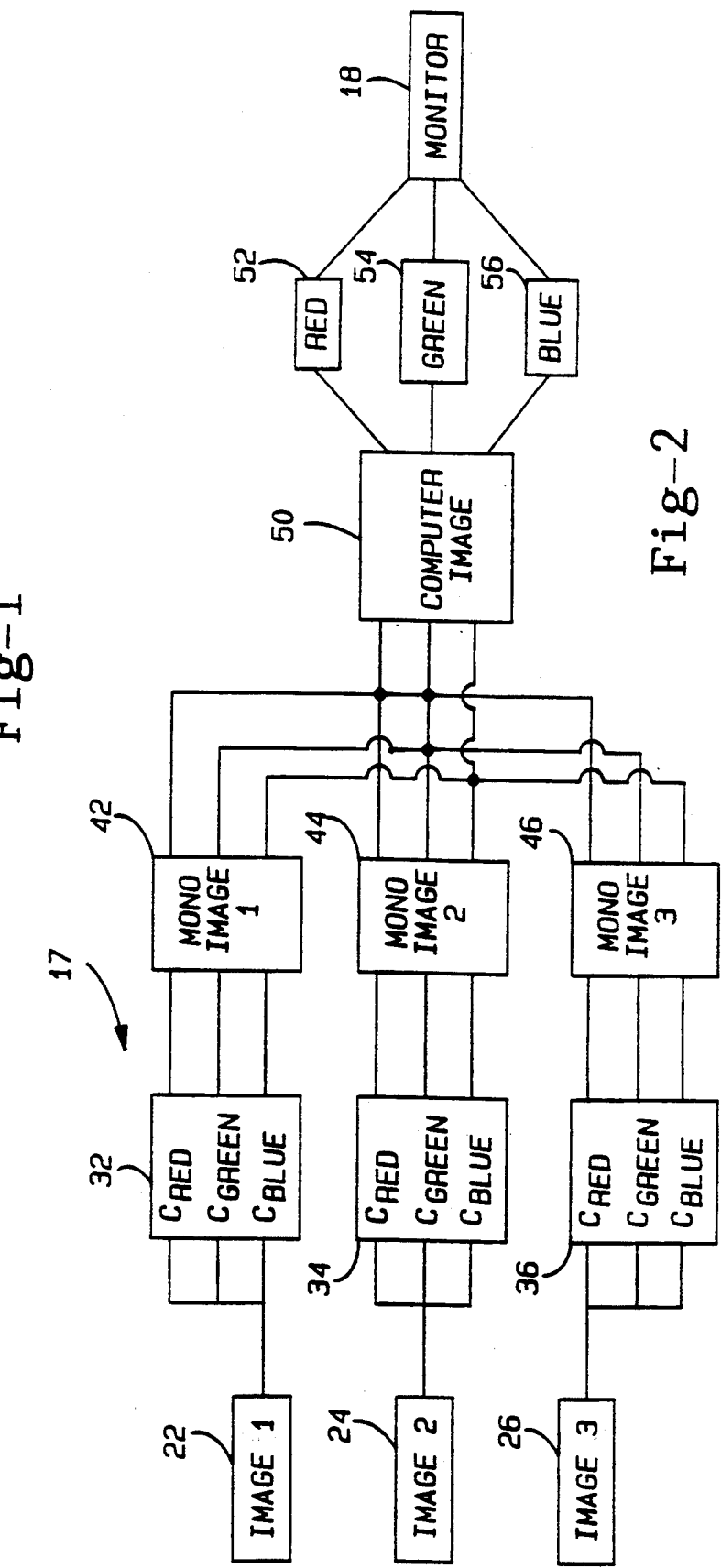

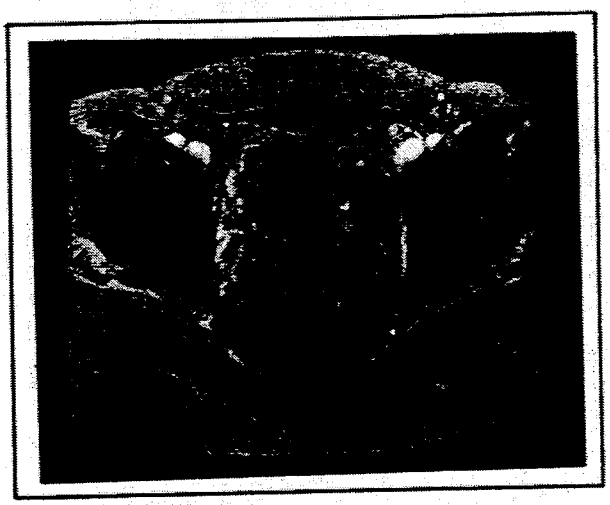
Fig-5D
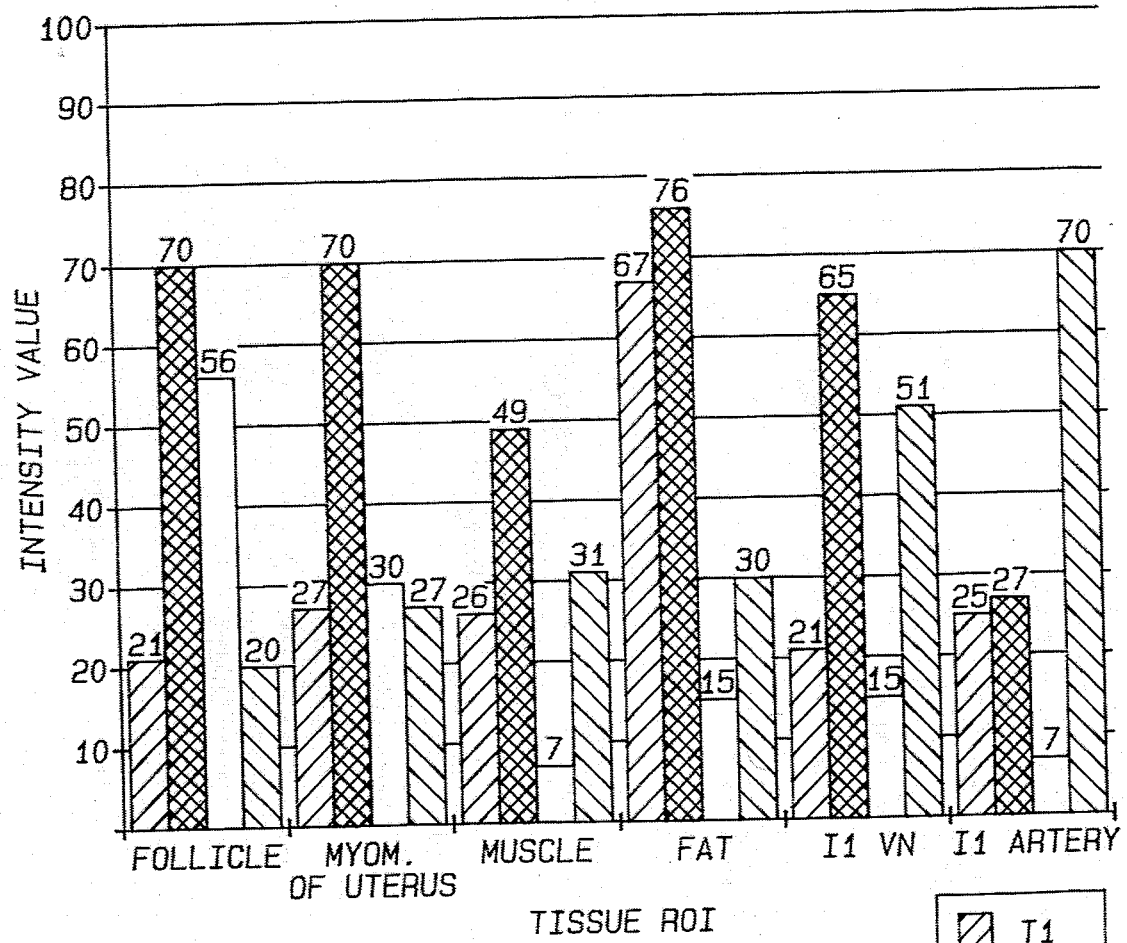
Fig-6
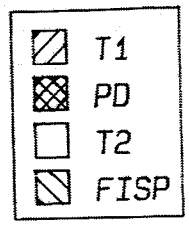

|  | RED | GREEN | BLUE |
|---|---|---|---|
| BITS PER COLOR: | 3 | 3 | 2 |
| COEFFICIENCY VALUES | | | |
| CONSTANT | 0 | 0 | 0 |
| $T_1$ (600/20) | 90 | 90 | 85 |
| $T_2$ (2600/90) | 0 | 200 | 0 |
| PROTON DENSITY (2600/22) | 50 | 50 | 0 |
| FISP (120/10/70°) | 120 | 0 | 0 |
Fig-7
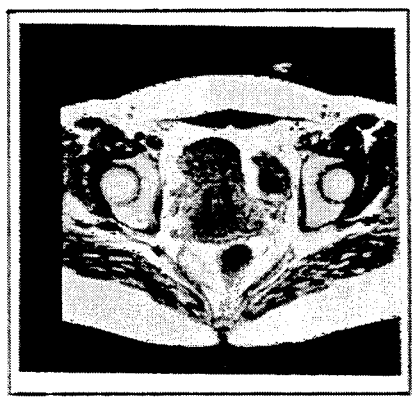
Fig-8A
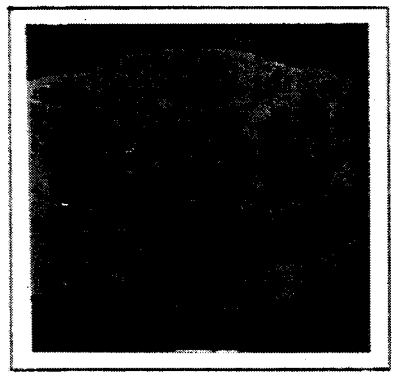
Fig-8B
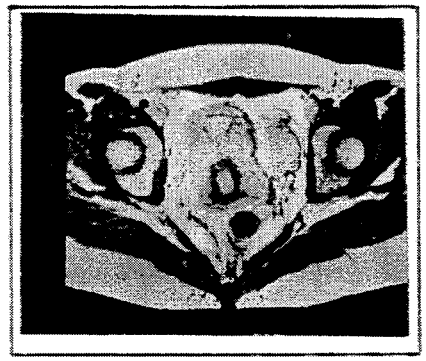
Fig-8C
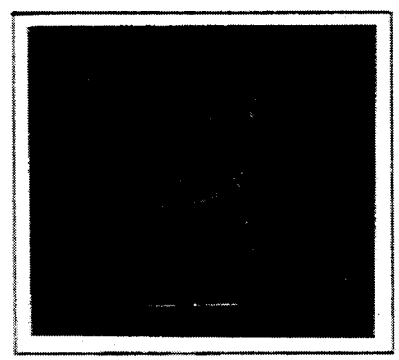
Fig-8D

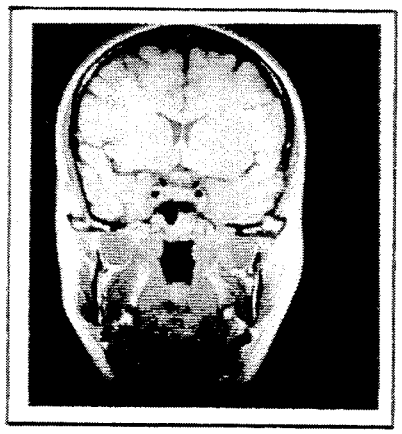
Fig-10A
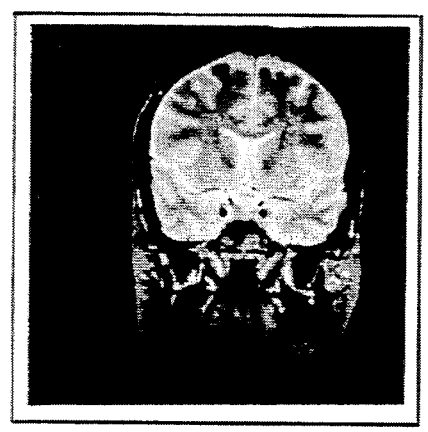
Fig-10B
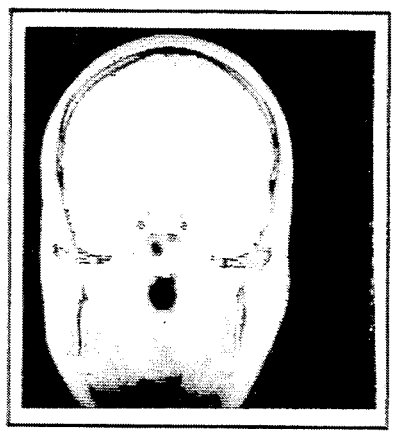
Fig-10C
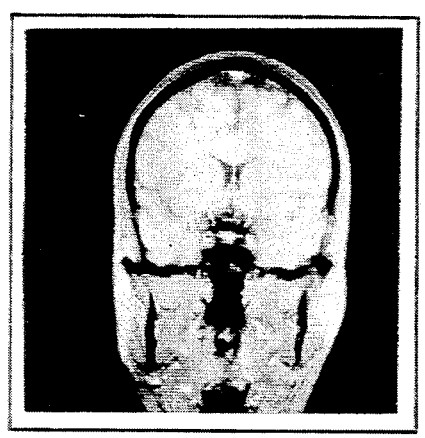
Fig-10D
|  | RED | GREEN | BLUE |
|---|---|---|---|
| BITS PER COLOR: | 8 | 8 | 8 |
| COEFFICIENCY VALUES |  |  |  |
| CONSTANT | 0 | 0 | 0 |
| T1 | 30 | 30 | 10 |
| T2 | 0 | 100 | 25 |
| PROTON DENSITY | 50 | 5 | 0 |
| FISP | 100 | 0 | 0 |
Fig-12

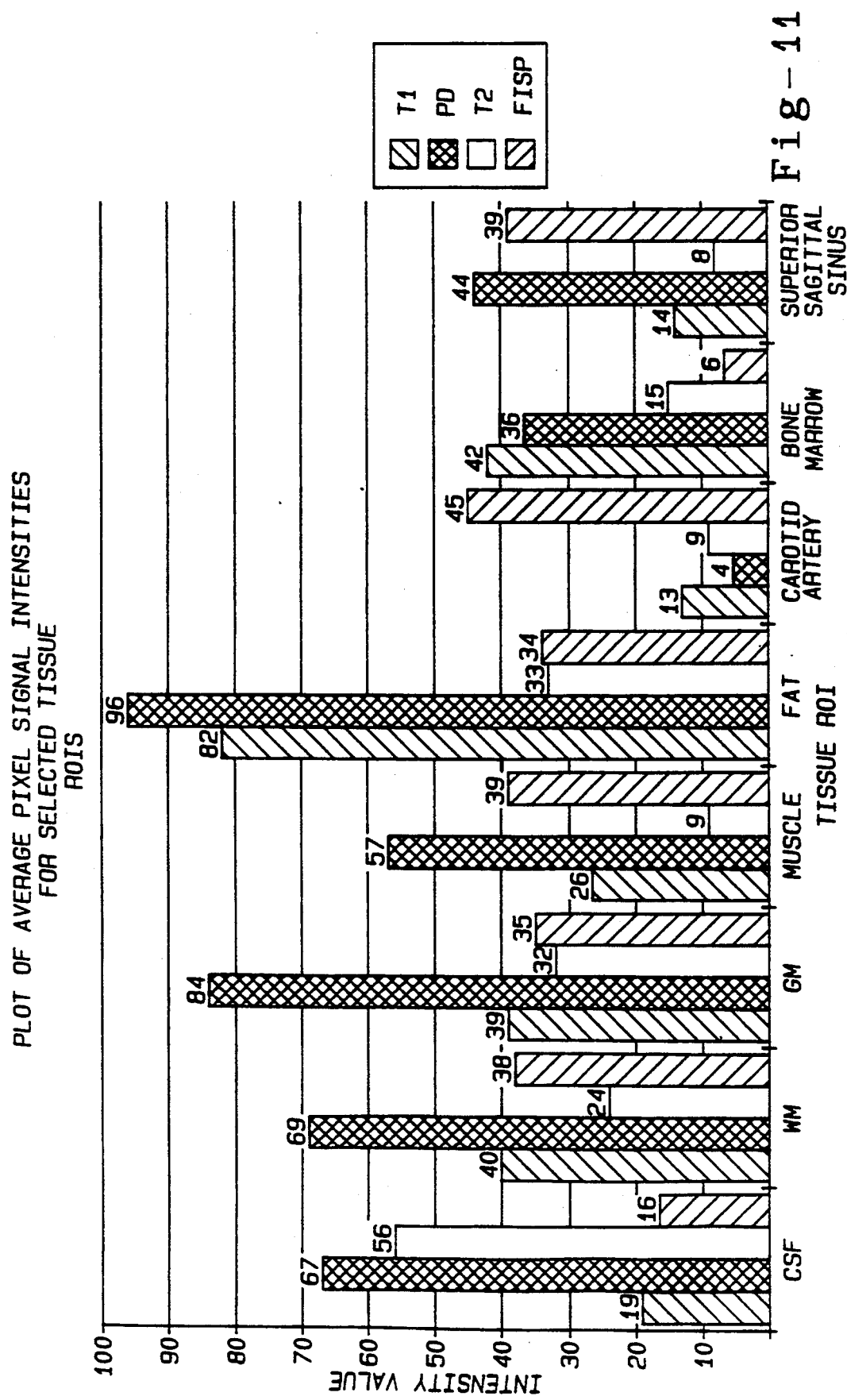

MAGNETIC RESONANCE IMAGING COLOR COMPOSITES

This is a division of application Ser. No. 871,406, filed on Apr. 21, 1992.

TECHNICAL FIELD

The invention relates to a method and apparatus for color coding a plurality of multiparameter images and the subsequent combination of the color coded images to a final composite image having a semi-natural appearance. More particularly, the invention is directed toward producing color composite images for displaying a semi-natural color rendition of anatomical, physiologic and pathological features.

BACKGROUND OF THE INVENTION

Magnetic resonance imaging (MRI) is a rapidly advancing technology which provides new opportunities for the enhanced visualization of anatomic, physiologic, and pathologic features by using a single diagnostic imaging modality. This technology is based on the principle that protons within body tissues and fluids can absorb and then subsequently emit radio frequency (RF) signals when placed in a strong magnetic field. It is the detection of the emitted RF signals from three-dimensional tissue voxels that provides data for the spatial location and contrast discrimination of specific tissues, which are ultimately displayed as pixels comprising a two-dimensional MR image. The intensity of each individual pixel is determined by several biophysical characteristics of the tissue within the voxel. These characteristics include longitudinal relaxation rate ($T_1$), transverse relaxation rate ($T_2$), proton density, and flow velocity and direction. To emphasize contrast patterns of specific tissues, different image acquisition parameters or pulse sequences are utilized to produce various types of "weighted" images. The selection of different pulse sequences allows for the generation of spin echo images that are $T_1$-weighted, $T_2$-weighted, or proton density weighted. Furthermore, gradient echo pulse sequences, or "fast scans", can be utilized to obtain images that possess additional unique tissue-contrast patterns. In each type of image, individual tissues appear differently based on their own inherent biophysical characteristics.

Because the intensity characteristics of individual tissues in different types of MR images are dependent on the pulse sequence parameters selected for image acquisition, various persons have attempted to develop both gray-tone and color display methods for tissue characterization, based on pattern recognition or multispectral analysis techniques using multispectral MR image sets. In color cathode ray tube (CRT) systems and in color raster graphics, the process of additive color mixing creates a spectrum of colors through the superimposition of red, green, and blue visible light regions. Additive color mixing has also been utilized in the National Aeronautic and Space Agency (NASA) LANDSAT satellite imagery system to generate color composites from multispectral image sets. In this system, multiband infrared images are remapped to each of the three primary colors and then superimposed on one another to form a single image possessing a spectral scheme that is based on additive RGB color combinations of spatially aligned pixels. Because of their multiband nature, this same type of image processing has been utilized to generate RGB composites from sets of different types of MRI. Advantages include the potential for a more realistic appearance in computer-generated images, enhanced ability of the viewer to interpret different types of data present in an image, and since color images may display variable hue, saturation, and brightness values much more information may be conveyed to the viewer.

Vannier et al have demonstrated computer-generated color displays by producing classified images with enhanced discrimination of different body tissues and fluids, as set forth in Multispectral Magnetic Resonance Image Analysis, (Crit. Rev. Biomed. Eng., 15:117–144, 1987). Vannier has produced color composites by assigning red or green or blue (RGB) to two or three channels to produce the composite. A problem with this type of system is that the arbitrary and simple direct assignment of one image to red, another to green, and a third to blue, limits the channels to three, and usually does not provide desired visual characteristics to allow for semi-natural tissue appearances. Furthermore, Koenig et al in Pattern Recognition for Tissue Characterization in MR Imaging (Health Care Instrum., 1:184-187, 1986) investigates the area of pattern recognition for tissue classification. Köenig et al classified four types of tissue by pixels defined by a feature vector which contained information from computed MR parameters. These parameters were represented by gray value, neighborhood relations and texture. The image acquisition parameters or pulse sequences used were nonstandard or not the routine protocol for brain MR imaging. In Köenig's methods, multiplication of a feature vector by different functions maps a pixel into a decision space so that pixelwise classification is accomplished by the decision for the maximum components of the estimation factor. In other words, this is a statistical classification scheme which creates high contrast, graytone masks which map the highest probability class based on a priori training of a classifier function. Such classification methods are important and hold promise but are generally not clinically feasible due to the requirement for training the classifiers, the inherent problems of "computer diagnosis" and consequent physician non-acceptance. Since it segments tissue types by a strictly mathematically method, there is a potential for misclassification of volume averaged or continuous gradient intensities which are common in MRI. Kamman et al in Unified Multiple-feature Color Display for MR Images (Magn. Reson. Med., 9:240–253, 1989) has proposed a color display method based on calculated $T_1$ and $T_2$ relaxation times, as well as the proton density, of particular tissues of interest. Color images that simultaneously represent both $T_1$ and $T_2$ relaxation times were generated by mixing the primary colors of R, G, B. However, a color scale is required to interpret color "code" and this method is limited to three channels, $T_1$ and $T_2$ comprised of images which are not in the same visual format (calculated images) as would be viewed for standard and routine MRI diagnostic evaluation.

In U.S. Pat. No. 4,690,150, issued Sep. 1, 1987 in the name of Mayo, Jr., a method of producing a color overlayed image taken from a monochrome image is described. The method includes the steps of scanning for the image, i.e., MRI, storing the image in memory, and thereafter filtering the image by utilizing a dividing circuit and an average value circuit. The divided image along with the background information is sent to several ROMs associated each with the red, green and blue outputs. The ROMs include look-up tables which determine the values of the red, green and blue. Thereafter, the output signals from the RGB are sent to digital to analog converter for display on a CRT monitor. The patent produces a pseudocolor component thematic mapping limited to two channels in which a second image treatment is modulated by its pixel values' relationship to corresponding pixel values of the first image. The pseudocolor images produced provide two images which convey to different parameters.

A second U.S. Pat. No. 4,789,831 issued Dec. 6, 1988 in the name of Mayo, Jr. describes a similar method to his previously mentioned method in that a first image is used as an intensity image while a second image is used to tint the first image. This hue being determined by the sign and magnitude of deviation of the second from the first image. This method appears to be limited to two images ($T_1$ and $T_2$), does not produce seminatural color assignments and may create visually confusing color images.

U.S. Pat. No. 4,998,165, issued Mar. 5, 1991 in the name of Linstrom discloses a method of selectively changing monochrome color signals to color in diagnostic imaging. The method includes receiving the video signal of a monochrome image, stripping- the synchronizing signal therefrom, and sending same through an analog and digital converter for digitization of each pixel. The signal is thereafter sent to three memories each associated with red, green and blue and each comprising a different look-up table depending upon the magnitude of the monochrome image. The look-up tables assign a value to each of the pixels depending upon whether it is a low, medium or high magnitude in the video signal, i.e., intensity. The output of the RGBs are sent to a digital to analog converter thereafter to a monitor. The Linstrom patent is basically a pseudocolor method to apply color to a single achromatic or graytone image so that the single image pixel intensity values have been assigned colors. The application of this method appears to be primarily for single parameter modalities. It is therefore limited to a single channel or image.

Although the color display methods previously described have yielded images with enhanced differentiation of various tissues and fluids, most of the images that have been generated possess unnatural color combinations that often require special legends or understanding the often complex algorithms used in order to facilitate their interpretation by the viewer. Furthermore, many of the methods produce either pseudocolor or arbitrarily assigned false color composites. The pseudocolor is applied to single parameter images, and produces unnatural boundaries or contours non-existent in the original image based upon applying color by using ranges of pixel values. In false color, when R, G, B are each assigned to an image the following results are expected.

If a spatially corresponding pixel has a high intensity on all images, the composite pixel is white, if one pixel is high and red, a second is medium intensity and green, and a third is dim and blue the false color composite will be orange, etc. The composite color is simply based on the linear combination of the component monochrome pixels' hues, saturations and intensities (colors) into a resultant voxel.

The problem with pseudocolor images is that with multiple pulse sequence MR the difference in pixel value ranges within one image conveys only spatial information for that "weighting". Using the intensity of a pixel as an address for color look-up table assignments produces a single parameter image displayed as sharply designated regions indicating some finite number of divisions of pixel intensity range. This is fine for single parameter displays such as thermography. However, this creates visually confusing spatial images with artificial contours. Furthermore, reference to a color code table would be required for interpretation as in thermography. For there reasons, pseudocolor methods do not produce semi-natural, visually coherent, or intuitively transparent color images. The artificial graded contours in what should have been smooth gray-tone transition introduces false and misleading spatial information. This is very troublesome in diagnostic radiology.

Additionally, the information which is intended to be conveyed is the relative intensity of corresponding pixels in each of the channels or images of the multiparameter set. This point is well appreciated in the prior art as multispectral analysis, pattern recognition and other statistical classifications algorithms. These are important and appropriate applications for multiparameter data. However, the same introduction of artificial contours, the subjectivity to inhomogeneous field strength and other instrumental variations pose very significant problems for a strictly quantitative statistical classification approach to providing a thematic map representing specific tissues and fluids.

Advantages of color image display, in contrast to achromatic or monochromatic presentation, include the potential for a more realistic appearance, enhanced information processing, and increased ability of the viewer to discriminate and interpret related and unrelated data. Moreover, while each display point in a gray-tone image possesses intensity as its only variable, each display point in a color image has three variable attributes hue, saturation, and intensity, which allows greater information capacity within the display.

SUMMARY OF THE INVENTION

The invention is a method and apparatus for producing a single color composite image from a plurality of multiparameter magnetic resonance image sets, which includes: obtaining a plurality of spatially aligned gray-tone magnetic resonance images at a plurality of predetermined pulse sequences to provide data of the spatial location and contrast discrimination of tissue voxels in the form of pixels having varied intensities; identifying selected regions of interest in each image representing tissues, fluids, etc.; plotting average signal intensities of pixels within each region of interest for each image according to each tissue voxel, assigning a different monochrome color to each of the images based on the signal intensities and on a desired final color rendition of a composite image formed of the plurality of images; producing polychrome color images of the plurality of gray-tone images by combining the monochrome color with its respective image forming pixels having varied saturation and intensity in each image. Thus, combining the plurality of monochrome images into a single composite image having pixels of varying hue, saturation and intensity based on the intensity of the original gray-tone images and on the assigned monochrome colors forms the composite image having semi-natural anatomic appearance.

The invention provides the following advantages: the visual format of the original images is the same as would be viewed for common practice diagnostic evaluation; there is no requirement for the spatial information of the monochrome images to be altered or adulterated by statistical thresholds or modulations; hue assignment to the images is determined interactively or by default to known coefficiency tables, which, given the pulse sequences used, and biophysical parameter shown, will produce a desired semi-natural color rendition of the multiparameter; the simplicity of understanding the linear combination of individual image intensities and the combination of hues to produce the composite hue; the final additive color assignments can be easily defined in terms of the intensity levels of various tissues within the component gray-tone images as well by the colors the images have been assigned; the gray-tone $T_1$, $T_2$, etc. tissue contrast patterns are translated into various color assignments that can be intuitively interpreted based on a basic knowledge of RGB color combinations.

FIGURES IN THE DRAWINGS

Other advantages of the present invention will be readily appreciated as the same becomes better understood by reference to the following detailed description when considered in connection with the accompanying drawings wherein:

FIG. 1 is a schematic diagram of the apparatus of the subject invention;

FIG. 2 is a more specific schematic diagram of the computer forming the multi-channel composite image;

Figure 9A:
Figure 9B:
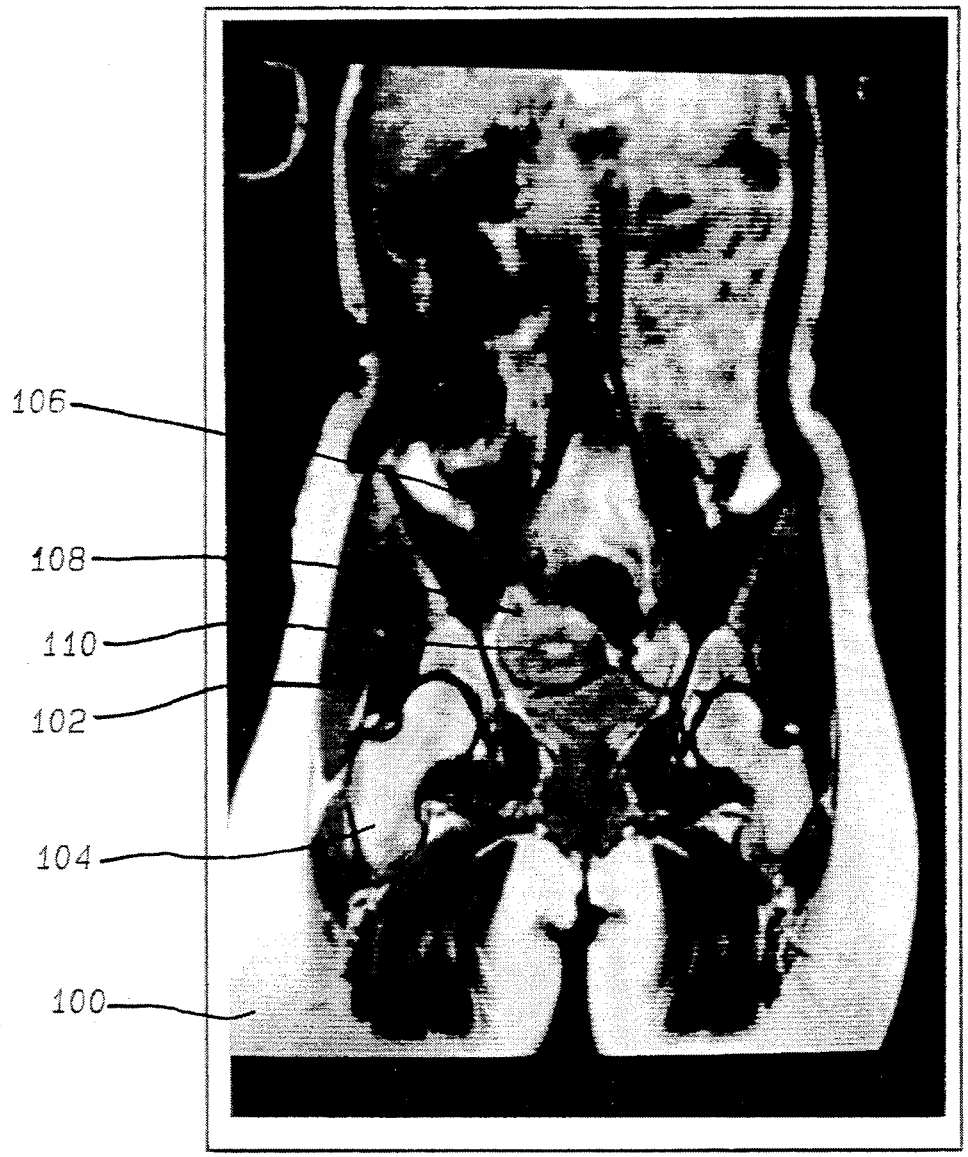
Figure 13:
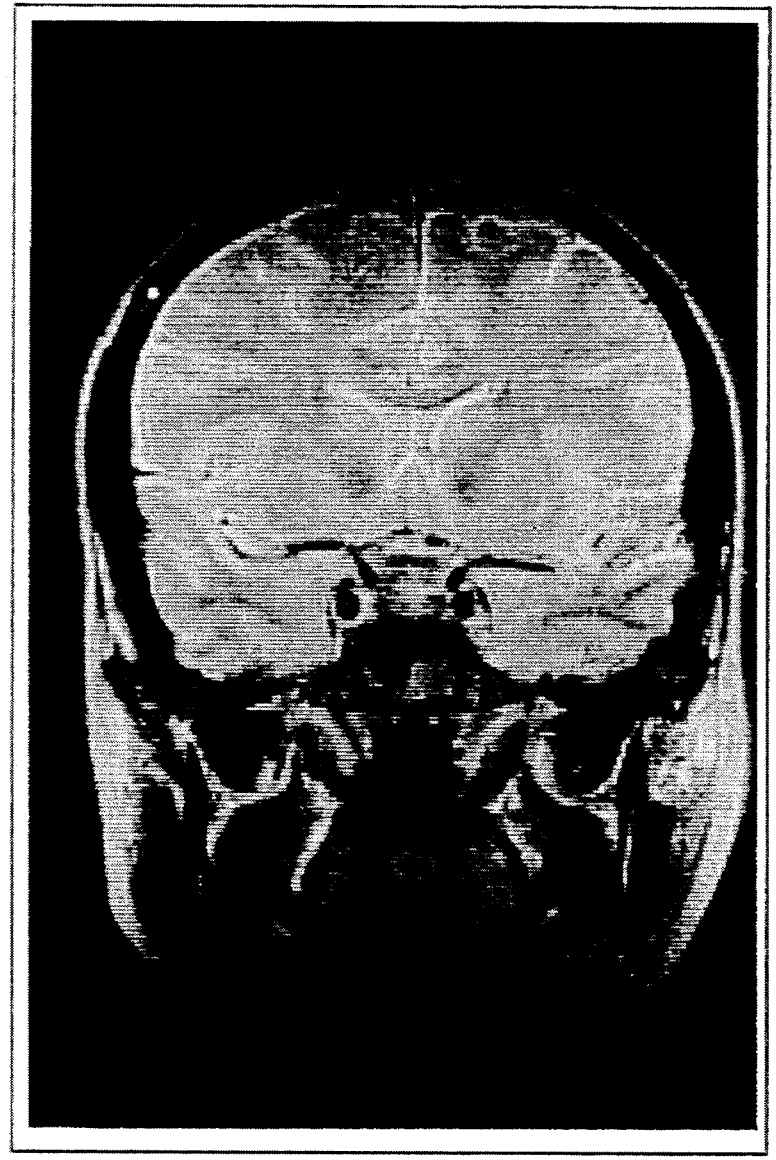
Figure 14A:
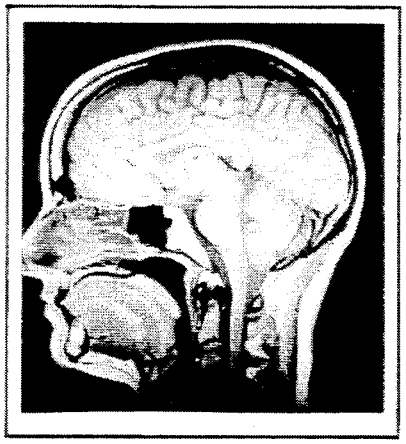
Figure 14B:
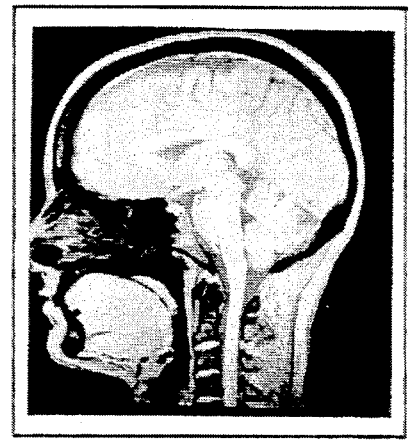
Figure 15A:
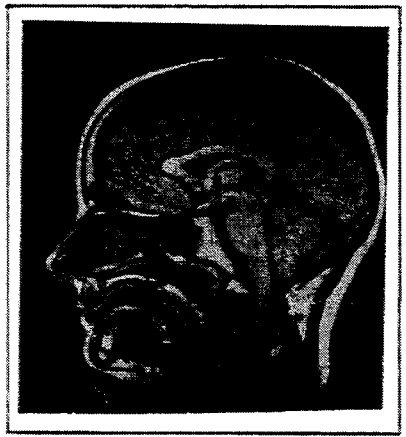
Figure 15B:
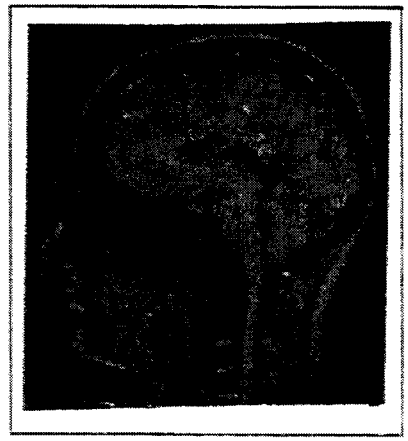
Figure 16A:
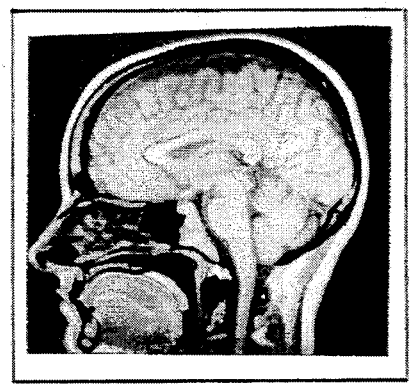
Figure 16B:
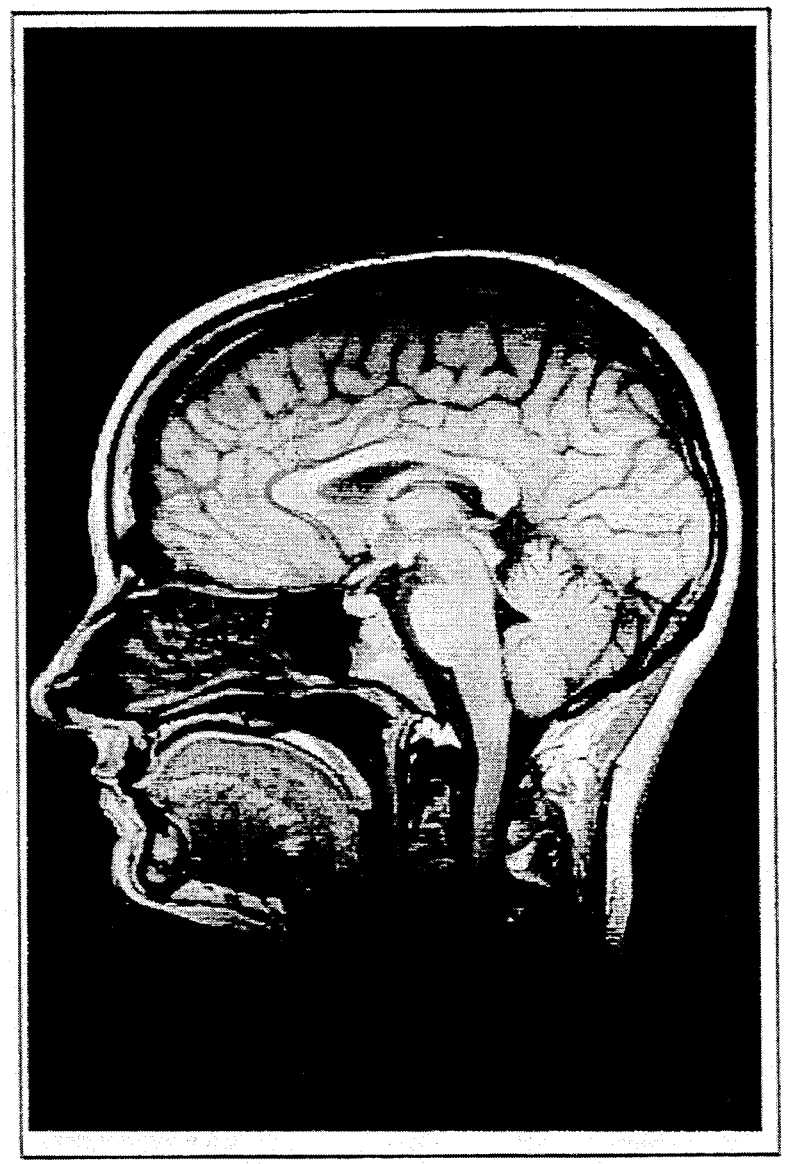
Figure 17A:
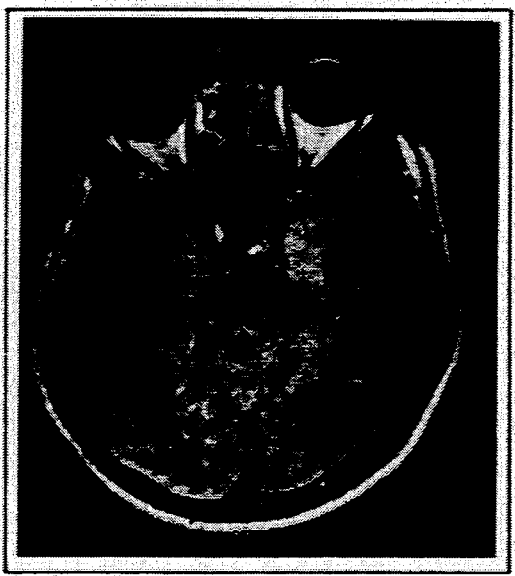
Figure 17B:
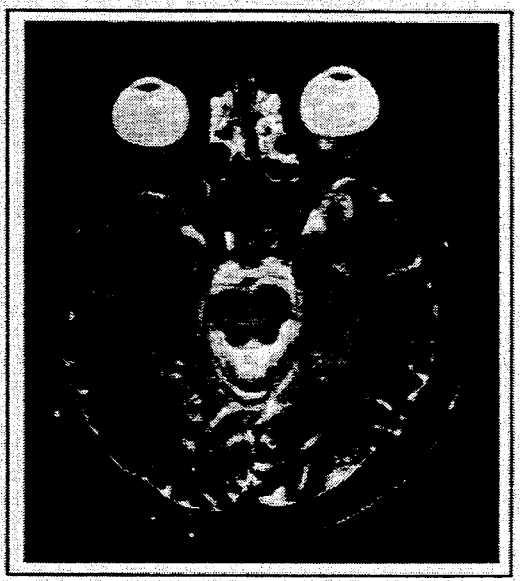
Figure 17C:
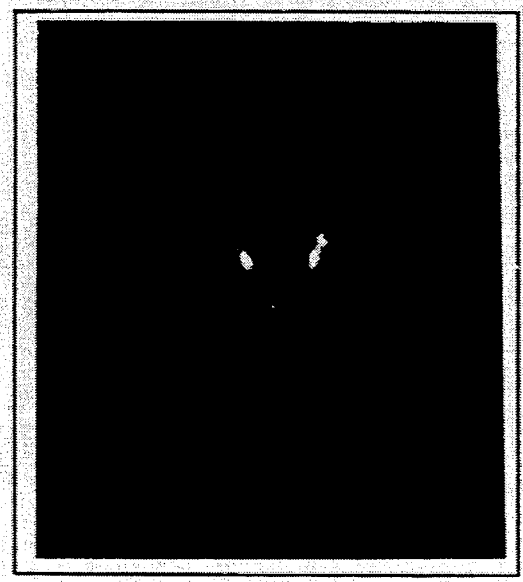

FIGS. 5a-d illustrate the four gray-tone images of the female pelvis;

FIG. 6 shows the plot of average intensities of selected regions of interest for each image of FIGS. 5a-d;

FIG. 7 is the color coefficiency table for the four images;

FIGS. 8a-d illustrate the monochrome images obtained from the images of FIGS. 5a-d and table of FIG. 7;

FIGS. 9a-b are the composite images of the monochrome images of FIGS. 8a-d;

FIGS. 10a-d are the gray tone images of the brain;

FIG. 11 is the plot of average intensities of selected regions of interest for each image of FIGS. 10a-d;

FIG. 12 is the color coefficiency table for the images based on FIG. 11;

FIG. 13 is the coronal brain composite of the monochrome images produced from FIGS. 10a-d;

FIGS. 14a-b are a second set of gray-tone images of the brain;

FIGS. 15a-b are the monochrome images of FIGS. 14a-b;

FIGS. 16a-b are the composite image of FIGS. 15a-b;

FIGS. 17a-c are the gray-tone images of a transverse view of the brain; and

Figure 18:
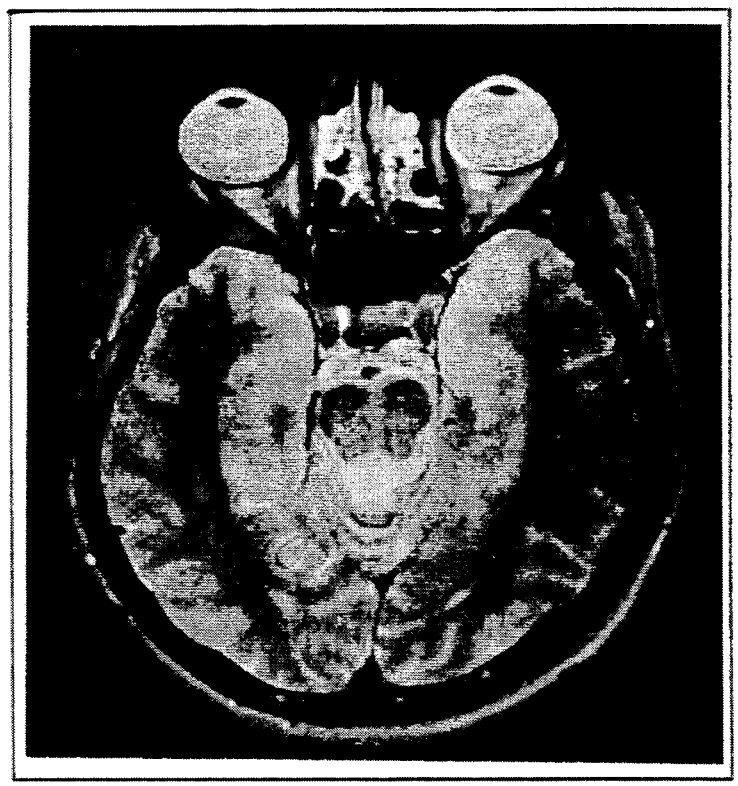

FIG. 18 is the composite image of FIGS. 17a-c.

DESCRIPTION OF THE PREFERRED EMBODIMENT

An apparatus for producing a single color coded composite image from a plurality of multiparameter magnetic resonance image sets is generally illustrated at 10 in FIGS. 1-2. It is to be understood that the subject invention is specifically described with respect to multiparameter magnetic resonance images of anatomical, physiological and pathological features. However, the invention may be applied to other types of imaging as one skilled in the art can understand.

The apparatus 10 includes imaging means 12 for producing a plurality of gray-tone or achromatic images, at specified pulse sequences. The plurality of spatially aligned images or channels are acquired using different pulse sequences, as is commonly known in the art. Typical images that were obtained are two-dimensional spin-echo images utilizing prescribed pulse sequences to obtain $T_1$-weighted images, $T_2$-weighted images, and proton-density-weighted (PD) images. Furthermore, flow sensitive, two- or three-dimensional gradient-echo (GRE) images were also obtained with specific pulse sequence parameters. The imaging means 12 for obtaining the image sets include a 1.5-tesla (T) General Electric Signa imager, and 0.35-, 1.0-, and 1.5-T Siemens Magnatom imagers, both utilizing a circularly polarized head coil and having an acquisition matrix of 256×256. Individual sections had a thickness of either 5 or 8 millimeters, and adjacent slices where acquired with a 50% gap. However, it is to be understood that any suitable imager may be utilized, and may have a larger acquisition matrix.

The apparatus 10 also includes transfer means 14 for transferring the data of the gray-tone images from the imagers 12 onto magnetic tape. It is to be understood that the transfer of data could be accomplished by other methods commonly known in the art, such as optical disks. Also included is a tape reader (not shown) for transferring the data from the tape to a useable electrical signal.

Figure 4:
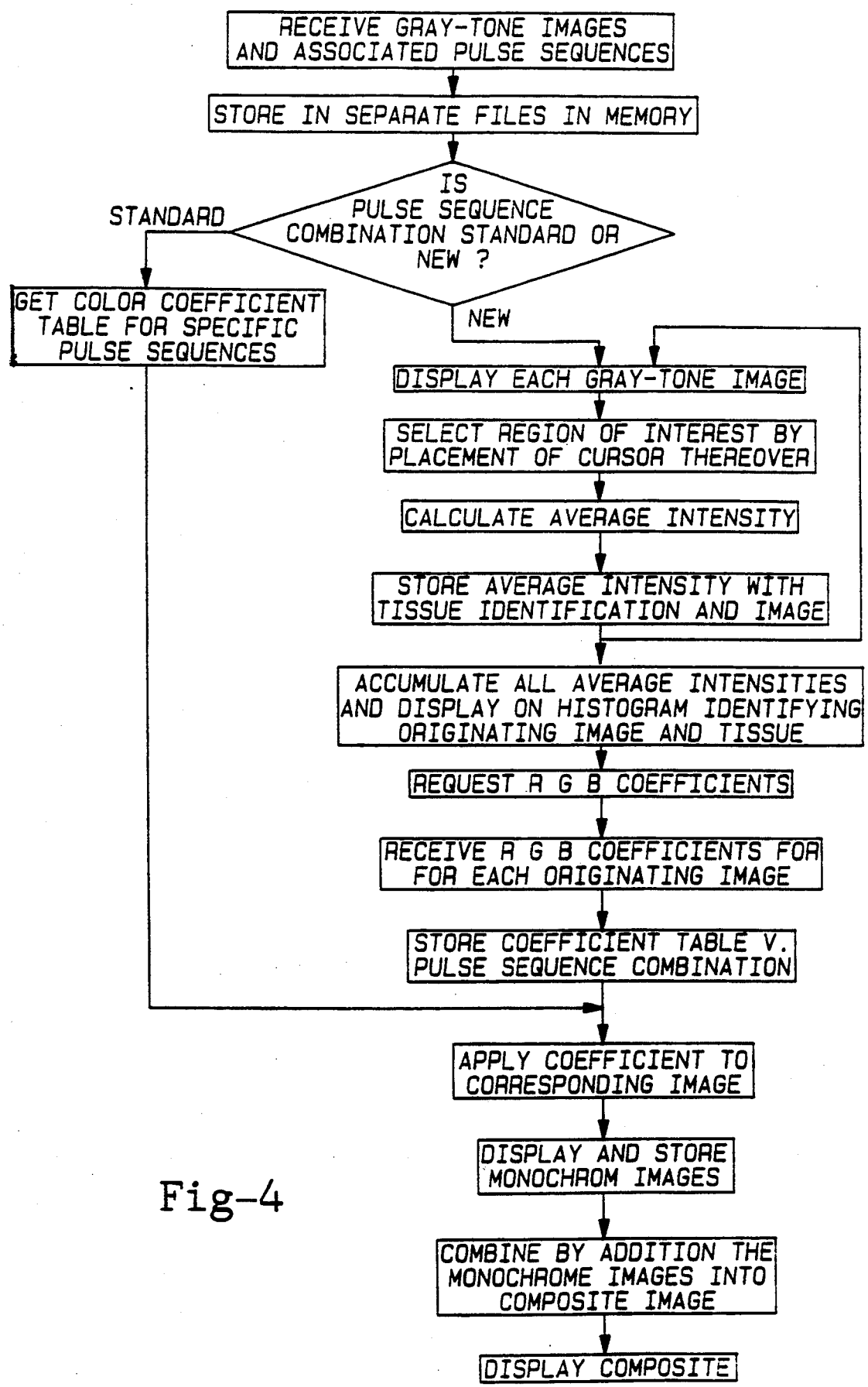
FIG. 4 is a flow chart of the software of the computer of the subject invention.

The apparatus 10 also includes processor means 16 for receiving the data of gray-tone images from the tape or electrical signal, and for processing same. The processor means 16 is generally a computer preferably of the type DEC micro VAX II, by Digital Equipment Corporation. Software utilized in the computer 16 is generally available of the type Interactive Digital Language by Research Systems, Inc. The software is capable of linearly applying color to the gray-tone images, and forming a composite imaging based on several original images by the addition of one to another, etc, according to the flowchart of FIG. 4. The software is stored in memory 17 of the computer 16.

The apparatus 10 also includes output means 18 for displaying the final composite image, and any of the component images. More specifically, the output means 18 is an Electrohome ECM 1301-X VGA monitor, by Electrohome, Ltd. It is an 8-bit graphic monitor. However, it is also within the realm of the invention to use an expanded bit monitor, as is subsequently discussed.

FIG. 2 illustrates the more specific structure of the computer 16 and memory 17 in forming the composite image. The different images ($T_1$, $T_2$, spin-echo, gradient echo) are stored in memory 17 in separate files 22, 24, 26. Each file 22, 24, 26 has a color coefficiency table 32, 34, 36 assigned thereto in order to assign a percentage of R, G, B channels thereto, as subsequently described. In FIG. 2, "C" designates coefficiency value defining the contribution of the particular image to the R, G or B output channels. It is to be understood that any number of images may be combined in this manner, i.e., two, three or four.

Monochrome images 42, 44, 46 are formed and stored based on the color coefficients, and thereafter, the pixel values are added to form a composite image 50 stored in memory for pixel location, hue and intensity. The coefficiency tables 32, 34, 36 apply the monochrome color to the images, i.e., superimposition, and are stored in image memory 42, 44, 46. The pixels for the composite image are sent to the RGB output channels 52, 54, 56 via a standard digital to analog converter (not shown) for display on the monitor 18. Use of RGB channels for controlling color output is commonly known in the art, and as discussed in the Background.

Figure 3:
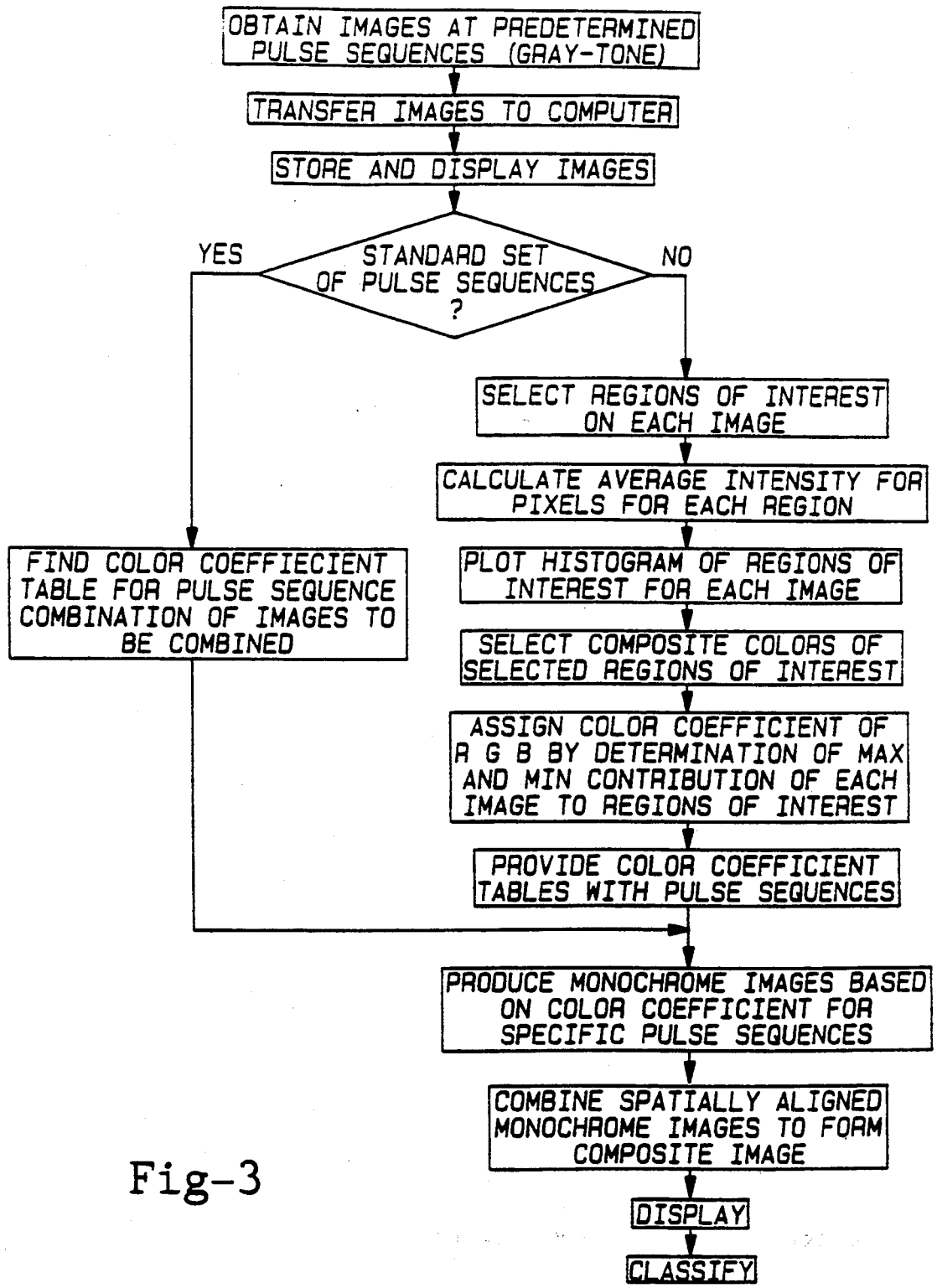
FIG. 3 is a general flow chart of the method of the subject invention.

The apparatus 10 is utilized to implement the method illustrated in the flow chart of FIG. 3. Specific pulse sequences are selected to provide the preferred protocol for the required diagnostic evaluation. MR images are obtained at these pulse sequences utilizing the imager 12. Generally, the image sets obtained include the spin-echo and gradient echo images. Thereafter, this data of gray-tone images is transferred via magnetic tape to the computer 16 for processing thereof.

For certain tissues within each gray-tone image to be combined, the average signal intensities of pixels within operator-selected regions of interest are calculated, generally by the software, in order to provide quantitative data supporting qualitative assessments of tissue contrast behaviors. The tissue regions of interest are selected from various anatomical and confirmed pathological sites to calculate the mean pixel signal intensities and their standard deviations for corresponding pixels within identical regions of interest in a spatially aligned, simultaneously analyzed image sets. The computer 16 performs this operation upon operator selection of the tissue by activation of a mouse driven cursor over a selected region of interest. The actual pixel intensity values are normalized to a 1 to 255 intensity scale so that the minimum intensity value ($Data_{min}$) becomes 0 and the maximum ($Data_{max}$) becomes 255. This normalization is accomplished by using the following equation.

$$Output = 256 \times \frac{Data - Data_{min}}{Data_{max} - Data_{min}}$$

A normalized output value is calculated for each actual pixel intensity value or data in the image matrix. The mean and standard deviations of the actual signal intensities and normalized output values of all the pixels within a selected region of interest is reported.

The quantitative measurements of the normalized pixel values (0–255) for each region of interest in each image or channel are plotted in a histogram. This may be accomplished by hand or by appropriate software, such as by the previously discussed software. As an example, in a selected T1 weighted image of female pelvis, the mean pixel value (MPV) for fat is MPV=67, ovarian follicular fluid MPV=21, muscle MPV=26, and iliac artery MPV=25. In the T2 weighted image of the same anatomical slice, fat MPV=56 while in the proton density weighted image, fat MPV=70, etc. FIG. 6 illustrates other pixel values per pulse sequence. Based upon this information, color assignments are determined. Other histograms and regions of interest are set forth in the subsequent examples of the invention.

Based upon examination of this quantitative data, a determination of the predominant feature or characteristic depicted in each image or channel is made. Often, this is identified as the feature which exhibits the higher pixel values with the particular "weighting" used. In the previous example, follicular fluid is co-dominant in the T2-weighted and proton density images, and fat is co-dominant in the T1 and proton density weighted images. Muscle is slightly dominant in the proton density image when compared to the T1 and T2 weighted images.

From the normalized quantitative data obtained, image color assignments can be specifically selected so that the desired colors of specific tissues and fluids could be visually optimized in the final composites, based on standard red (R), green (G), and blue (B) computer0 generated color combinations and on characteristic tissue intensity patterns in the component image. Common knowledge of color contributions is relied upon. For example, the following RGB combinations (R, G, B) produce the following results: (100, 100, 0)=yellow; (100, 0, 100)=magenta; (0, 100, 100)=cyan; (100, 100, 100)=white; (0, 0, 0)=black.

A different monochrome color is therefore assigned to each of the entire of the images. Assignment is based on the following: the signal intensities or the quantitative signature of pixel values for each region of interest; the information to be conveyed by each channel; and the judicious consideration of the desired color composite rendition of these regions of interest.

In other words, a monochrome color must be empirically assigned to each image such that a desired polychrome outcome is predicted to result. In the female pelvis example, if ovarian follicular fluid is to be ideally portrayed as yellowish-green in the composite image, muscle is to be shown as a brownish-red color, and fat as a pale pinkish-yellow color; then it is appropriate to assign the T1 channel a monochrome color of unsaturated yellow (R=90, G=90, B=85). The T2 channel is assigned green (R=0, G=200, B=0) and the proton density channel is yellow (R=50, G=50, B=0). The gradient-echo channel is assigned red (R=120, G=0, B=0).

These coefficiency value numbers represent RGB contributions for each of the images used to generate the example composite of female pelvis. Recall that the quantitative signature of follicular fluid is comprised of the MPV ratio of T1: T2: proton density: FISP=21: 56: 70: 20. (FIGS. 7 and 8a–8d.) Accordingly, the composite color of follicular fluid 108 will be: $(21) \times (R=90, G=90, B=85) + (56) \times (G=200) + (70) \times (R=50, G=50) = (R=18, G=19, B=17) + (G=112) + (R=35, G=35) + (R=24) = (R=59, G=168, B=17)$. The composite image of follicular fluid will therefore be rendered as yellowish-green (R+G). The blue influence (B=17) would be negligible, very slightly unsaturating the hue.

In the example, since follicular fluid 108 is "bright" on both the T2 and proton density images but "dark" on the T1 image, the linear combination of the three monochrome images will provide a yellowish green color to identify this and similar fluids in the composite image. Since fat's MVP=76 in the proton-density image, MVP=67 in the T1 image, and MVP=15 in the T2 image, the resultant color composite is pinkish yellow. Since muscle 102 is "bright" in the proton density image, and "dark" in the T2 image, and moderate in the T1 image, a brick color results from the linear combination. Graduations of intensity within the same tissue type still retain the same basic proportions of RGB so that shading appears continuous and retains the same visually perceived color. For example see fat 100 in FIG. 9b. In order to obtain a semi-natural rendition of the important regions of interest, some experimentation with coefficients is necessary.

Assignment of the color coefficients to each image effectively produces monochrome images. Thereafter, the monochrome images are combined to form a color coded composite image. The final composite image is combined and generated utilizing the software in the computer 12. The software allows the combination of two or more spatially aligned MR images into a single composite image. The composite image produces a semi-natural color scheme for the anatomical tissue.

In general, persons associate specific visual colors with certain tissues and fluids. Therefore, the final composite image is intended to produce such expected, identifiable, natural colors in the composite. Pathologic conditions can easily be identified by variation from the known visual colors and contours. Particularly, the following colors have been identified as desirable for the final composite to identify specific tissues: brick red=muscle; greenish yellow=CSF; pinkish yellow=fat; bright red=flowing blood; air= black; brain cortex=flesh colored; white matter of brain=flesh variant; ovarian follicle=green; serous cyst contents=green; hemorrhagic cyst=brick-red, etc.

In the multichannel composite method, positive or negative integers may be assigned for the three primary colors R, G, and B. An assigned coefficiency value of zero indicates no contribution from that color for that particular image. Negative coefficiency values are designed to subtract the selected color. Individual R, G, and B output channels or images were created from the input images based on the coefficiency values assigned for each image. These three channels were then combined to form a single composite. In order to generate composite images with this method, 3 bits (8 intensity levels) were each assigned for R and G outputs, and 2 bits (4 intensity levels) were assigned for B output in an 8-bit color image. The method may also be applied with a 24-bit output image wherein 8 bits each were assigned to the R, G, B channels, as discussed subsequently. Based on the various intensity levels of spatially aligned pixels, additive combinations of the two or three primary colors resulted in a single image possessing a composite of all the information present in each of the original input images, unmodified from the original gray-tone images, i.e., the intensity of each pixel is unchanged. The images displayed on the monitor 18 were photographed on ASA 200 color slide or print film with the aid of a macro zoom lens by using exposure times of ⅛ and 1/15 second and an F setting of 3.5, which images were color laser copied and are illustrated in the Figures, as subsequently referred.

More specifically, the invention has been applied to MR imaging of the female pelvis and brain, and will provide examples of the invention which will be explained in detail with reference to the Figures.

Because MRI has superior soft-tissue-imaging capability, it is an excellent modality for visualizing the conents of the female pelvis. Based on tissue region of interest calculated means pixel intensity values, various colors where applied to spatially aligned images so that tissue contrast patterns could be optimized in the final composite image. It is possible to generate seminatural-appearing color images of the female pelvis that possessed enhanced conspicuity of the specific tissues and fluids.

Figure 5A:
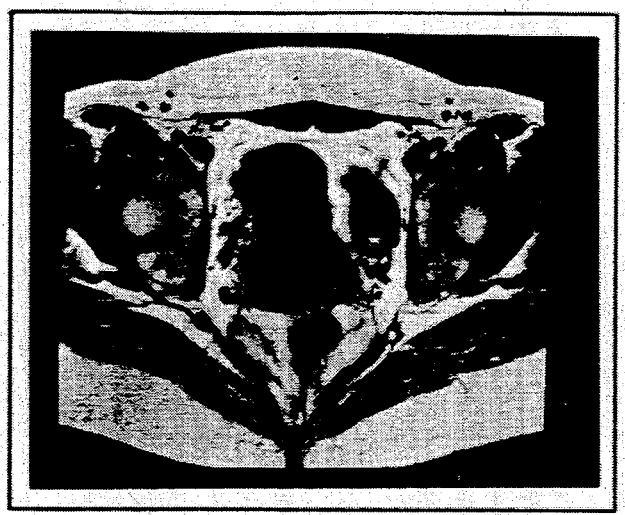
Figure 5B:
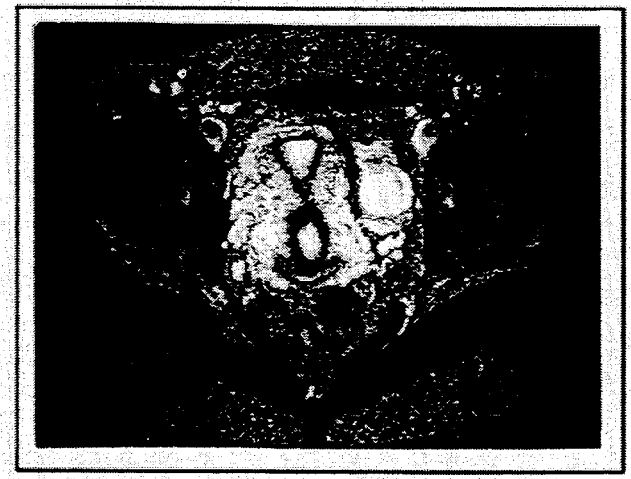
Figure 5C:
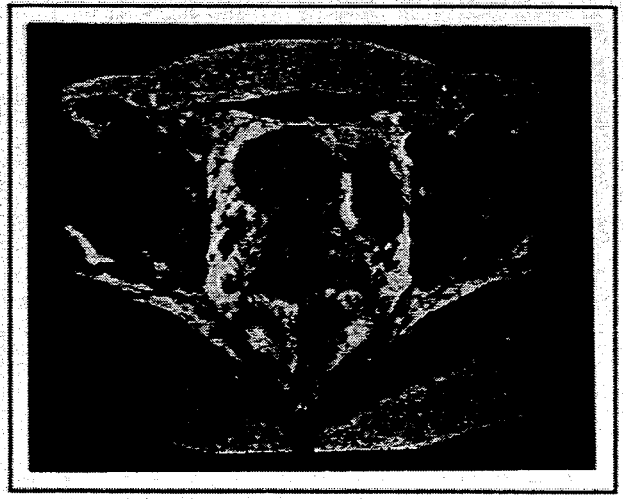

Spin-echo images where obtained using the following pulse sequences: $T_1$-weighted images had repetition time and echo time (TR/TE) values of 600/15 and 600/20; $T_2$- weighted images have TR/TE values of 2000/60, 2500/80, 2500/90, 2600/90 and 2700/70; and proton-density-weighted images had TR/TE values of 2000/30, 2500/20, 2500/28, 2600/22 and 2700/28. The gradient-echo images included the following pulse sequence parameters (TR/TE/flip angle): 120/10/70°, 200/11/10°, and 200/11/50°. Both two-channel composites and multichannel composites where formed from these gray-tone images utilizing the method and apparatus 10 described above. FIGS. 5a–d illustrate the gray-tone images. FIG. 5a is the $T_1$-weighted image (600/20), FIG. 5b is the $T_2$-weighted image (2600/90), FIG. 5c is the proton-density-weighted image (2600/22), and FIG. 5d is the gradient-echo image (120/10/70°), obtained using the 1.5 T imager.

When a composite using additive color combinations is formed, if one image is assigned all red and the other all green, tissues whose contrast behaviors are similar will appear as various intensities of yellow, depending on whether their respective signal intensities are high, intermediate, or low. Tissues that are hyperintense on one image and hypointense on the other will appear either red or green depending on which color is assigned to the image possessing the hyperintense tissue. A plot of the normalized tissue intensity characteristics for each of the images is illustrated in FIG. 6.

The subject invention was utilized to produce a composite image containing all four images: spin-echo and gradient-echo images. FIG. 7 illustrates the color coefficiency table for this composite image, so that the tissue regions of interest have a seminatural color appearance. FIG. 8a–d illustrate the monochrome image of the original gray-tone images of FIGS. 5a–d with the color coefficiency table applied thereto. The image in FIG. 9a is a four-channel RGB composite created by combining the axial $T_1$-, $T_2$, and proton-density-weighted images with an axial angiographic gradient-echo images of FIGS. 8a–d. Based on its intensity characteristics in the component images (bright on $T_2$-weighted image, medium to dark on other images), a developing follicle 108 was colored green in this composite. Seminatural and ideally expected colors for fat 100, muscle 102, bone marrow 104, differential flow rates within the iliac vessels 106, and uterine myometrium 110, and air 111, were produced. Fat 100 is a pale pinkish yellow color, muscle 102 is a brick red color, iliac vessels 106 are a bright red color, ovarian follicles 108 are a yellow green color, and uterine myometrium 110 is a greenish color. A coronal view of the female pelvis using the same parameters and assignments is shown in FIG. 9b. Note the intensity gradations in fat 100 is visually perceived as the same tissue. Urine in the bladder is green indicating high intensity in $T_2$ corresponding spatially to low intensity in the $T_1$ image connoting the biophysical properties of a watery fluid.

Two-channel composites were also produced by combining two images, each wholly assigned to only one of the RGB channels. A color composite of the $T_2$ and proton-density-weighted images was created by assigning the proton-density-weighted image completely to the R output (R=200, B=0, R=0) and the $T_2$-weighted image completely to the G output (G=200, B=0, R=0). Since follicular fluid was bright on both the $T_2$-weighted and proton-density-weighted images, the resultant additive color was yellow. Muscle, which had a relatively low intensity on the $T_2$-weighted image and was somewhat brighter on the proton-density-weighted image, was brick-colored. Moreover, because fat was relatively bright on the proton-densityweighted image and somewhat darker on the T$_2$-weighted image, a slight orange tone was imparted to this tissue. The intensities of the uterine myometrium on both the T$_2$-weighted and proton-density-weighted (slightly greater intensity) images gave regions of this structure a brownish hue in the composite image. Overall, this composite provided graded, seminatural color tones exhibiting the combined intensity characteristics of both original gray-tone images.

A second composite of the same images is generated by combining the gradient-echo image in FIG. 5d assigned to the R output, with the T$_2$-weighted image in FIG. 5b assigned to the G output. The tissue contrast behaviors in the gradient-echo image were such that differentiation between various tissues was observed to be enhanced in this composite compared with the proton-density-T$_2$ composite previously discussed, while a seminatural color scheme for fat, muscle, and uterine myometrium was preserved. In addition, the intense signal of flowing blood in the gradient-echo image yielded a bright red angiographic effect within the iliac veins.

An additional proton-density-T$_2$ composite was generated by assigning a proton-density-weighted image to the R output and a T$_2$-weighted image to the G output. This composite demonstrates the zonal anatomy of the uterus within the context of a seminatural appearing image. In addition, in this composite, watery fluids [cerebrospinal fluid (CSF) and urine] appeared green, while the more mucinous cervical and intrauterine contents appeared yellow.

Vascular MRI is a non-invasive adjunct to conventional cerebral MRI studies. To detect parenchymal changes associated with vascular anomalies, optimal diagnostic evaluation requires the comparison of both spin-echo and anglographic gradient-echo MR images. Composite images were generated in which blood appears bright red while many stationarytissues posses near-natural colors.

There has also been developed an apparatus which utilizes a 24 bit color graphics to allow for expansion of the color and accuracy thereof. The method is the same, only the number of bits per pixel of the graphics has been expanded. This system has been applied to imaging of the brain, in a similar manner as previously described.

Spin-echo images were obtained using the following pulse sequences: T$_1$-weighted images had repetition time (TR) and echo time (TE) values of 600 and 20 msec; T$_2$-weighted images had TR and TE values of 2600 and 90 msec; and proton density-weighted images had TR and TE values of 2600 and 22 msec. In addition, two-dimensional acquired fast imaging with steady-state precession (FISP) gradient-echo images with the following pulse sequence parameters (TR/TE) were also obtained: TR of 120 msec, TE of 10 msec, and flip angle of 70°. Individual slices were either 5 or 6 mm thick, and adjacent slices had a 25, 40 or 50% gap. Transverse angiographic phase contrast images used three-dimensional acquired FISP protocol with TR/TE/Flip angle values of 23 msec, 13 msec, 20°. The slab was 32 mm thick and divided into 1 mm partitions. All images had a 256×256 acquisition matrix. The acquired gray-tone images are illustrated in FIGS. 10a–d. FIG. 10a is the T$_1$weighted image, FIG. 10b is the T$_2$-weighted image, FIG. 10c is the proton-density-weighted image, and FIG. 10d is the gradient-echo image.

Following image acquisition, selected image sets were then transferred to the computer 16. In the 24-bit embodiment, the computer 12 utilized is an IBM 386 PC compatible having a 24-bit ATVista videographics adapter card by Truevision. Image analysis studies and processing routines were performed using customized Image-Pro Color Image Processing System version 2.0 by Media Cybernetics software, in the computer 16. Color images were displayed on a high-resolution Mitsubishi Diamond Scan VGA monitor by Mitsubishi Electric.

For some tissues within analyzed MR, the mean signal intensities of normalized pixels within operator-selected areas of interest were calculated using the software program. These tissue intensity values provided quantitative data on which the empiric selection of specific image color assignments by the operator was based. For the four images (FIGS. 10a–10d) a plot of the histogram is illustrated in FIG. 11.

For each image, specific color assignments of RGB combinations of spatially aligned pixels were determined based on the histogram and desired composite colors for the tissue. To obtain near-natural composite colors, experimentation of various color assignments were accomplished. The coefficiency values used to generate the composite of FIG. 13 are indicated in FIG. 12.

Once the color values were selected, the component images were then merged into a single 24-bit color image (8 bits coded on each red, green, and blue channel) with a palette of over 16.7 million possible colors. To heighten the sharpness of the tissue borders on the composite image, a 3×3 kernel unsharp mask filter was applied to each RGB channel. The gamma correction was also adjusted for enhancement of image brightness. For presentation in this report, color composites were photographed on ASA 200 color slide or print film using an exposure time of 1/15 sec and an F setting of 3.5 and color laser copies of the images were made. FIG. 13 illustrates a four channel composite of the images of Figures.

A two-channel composite was generated by merging an angiographic high flip angle gradient-echo image (FIG. 10d) assigned red (R=100, G=0, B=0), with a spatially aligned T$_2$-weighted image (FIG. 10c) assigned green (R=0, G=100, R=0). The color percentage values were selected based on the tissue intensity patterns of the normalized values shown in FIG. 11. Because flowing blood was bright on the gradient-echo image and dark on the T$_2$-weighted image, it is colored bright red in the composite. A near-natural color assignment is also observable for muscle (brick-red), which possesses an intermediate intensity on the red image and a low intensity on the green image. Since white matter was hypointense relative to gray matter on both images, a medium brown was generated for this tissue type and a lighter brown was generated for gray matter. Other tissues that exhibit less natural colors include cerebrospinal fluid (CSF) in the lateral ventricles, which is colored green (bright on the green image, dark on the red image), and fat, which possesses a somewhat orange hue (slightly brighter on the red image).

To generate an additional near-natural appearing composite in FIGS. 16a–b, an angiographic high-flip-angle gradient-echo image (FIG. 14) was merged with a T$_1$-weighted image (FIG. 14) using the color percentage values of GRE(R=100, G=0, B=0) and T$_1$(R=30, G=100, B=50). The monochrome images are illustrated in FIGS. 15a–b. The selection of these values was based on the tissue intensity patterns of the normalized values in FIG. 11. In this composite (FIG. 16a, enlarged in FIG. 16b, blood vessels appear bright red because they were bright in the gradient-echo image, which was assigned red, and dark on the $T_1$-weighted image. In addition, near-natural colors are also observable for muscle (brick-red), fat (white), and brain (flesh-colored). Because of the low signal of CSF on both types of gray-tone images, the ventricular system appears dark.

The composite in FIG. 18 was generated by combining proton-density and $T_2$-weighted images (FIGS. 17a, 17b, respectively) with five corresponding phase contrast angiography subtraction images (hybrid image appears in FIG. 17c) using the color percentage values of PD(R=80, G=20, B=0), $T_2$(R=0, G=80, B=0), and PC(R=30, G=0, B=0). The selection of these values was based on the tissue intensity patterns of normalized values as in FIG. 11. In this composite, the excellent differentiation between gray matter and white matter achievable with proton density-weighted and $T_2$-weighted images is preserved with the addition of the vascular signal available from the phase contrast subtraction images. Because flowing blood was bright on the phase contrast subtraction images and dark on the images, this tissue is colored bright red. The intermediate intensity of muscle on the proton density-weighted image, which was colored primarily red, resulted in the generation of a near-natural brick-red color assignment for this tissue. Since they were brightest on the $T_2$-weighted image, CSF as well as aqueous and vitreous humor in the orbits appear green. Based on their intensities in the component images, fat is colored orange-yellow (bright on proton density image, intermediate on $T_2$ image), white matter is a medium brown (intermediate intensities on both images), and gray matter is a lighter brown (slightly higher intensities on both images).

The methods set forth represent an initial effort to present the combined tissue contrast information of both spin-echo images and angiographic gradient-echo images as single 24-bit color images in which the additive color assignments produced accurately represent the intensity patterns of the individual tissues and fluids in each of the component images. The color composites presented here were generated from two-dimensional acquired flow-sensitive gradient-echo images, and from gradient-echo images obtained using three-dimensional phase contrast MR angiography (MRA). With phase contrast MRA, it is possible to generate images in which the addition of the flow signal did not significantly alter the spin-echo contributions to the color scheme of the composites. This feature is important to maintain a composite image color scheme that preserves differential $T_1$ and $T_2$ intensity characteristics. Since the phase contrast images were subtraction images in which only the signal of flowing blood was bright, no additional image-processing techniques were needed to remove the signal of stationary tissues. Despite this characteristic, the presence of increased noise in the phase contrast subtraction images did contribute to a slight decrease in the image quality of the composite.

In terms of color palette for display, the latter composites presented here represent an improvement over the 8-bit system. This increase in display colors is due to a greater number of bits available for each RGB channel. Since the number of colors available equals $2^n$, where n is the number of available bits, 8-bit graphics only allow a maximum of 256 colors for display. With 8-bit graphics, the look-up table (color map) will assign the same color value for pixels that actually should have slightly different composite hue, saturation, and intensity values. Full color (24-bit) graphics allow the color display palette to consist of over 16.7 million colors such that composite pixel color assignments have much smoother gradations and are more accurate representations of tissue pixel intensity values.

With the advent of noninvasive vascular gradient-echo imaging techniques such as MRA, both the ability to better characterize cerebrovascular pathologies with MRI and the volume of data necessary for diagnostic interpretation have increased. Using the 24-bit color composite method described here, it may be possible to facilitate evaluation of this rapidly expanding data volume by merging multiple, spatially aligned, gray-tone images into single images that posses color-coded tissue assignments based on unique pixel intensity characteristics in the component gray-tone images. Because of the data display advantages afforded by color, the accuracy of MR interpretation may improve by using standardized magnetic resonance color composites as an adjunct to conventional gray-tone image sets. However, such speculation can only be supported or refuted following specific case study applications and appropriately formulated prospective clinical trials. With such studies, it will be possible to more fully characterize the clinical utility and potential role of 24-bit color composites in diagnostic MRI.

Currently, the diagnostic interpretation of MR images requires the back-and-forth comparison of images of the same anatomical scene in order to assess tissue-specific patterns of contrast behavior. It is possible that the combination of the diverse tissue contrast information present in several types of images of the same scene into a single color image might facilitate a more rapid, accurate diagnostic interpretation of MR images. Moreover, because of the increased conspicuity of specific tissues that is possible with color displays, particularly within the context of natural-appearing images using color composite methods, there is the potential for an enhanced ability to detect subtleties that might otherwise have been missed using conventional gray-tone images. The increased tissue conspicuity that is potentially available with these color display methods may lead to an increase in the accuracy of MR image interpretation. The utility of seminatural color MR composite images for educational and training purposes in self-evident.

MRI provides a plurality of serial slices which may be reconstructed as three dimensional images which can be interactively rotated, manipulated, dissected and examined by computer graphics methods known to the art. The subject invention is a means of generating pre-classified, seminatural color renditions of the composite multiple pulse sequence acquired slices.

Three dimensional reconstruction of the MR Color Composite serial slices will provide a graphic 3D model of the Anatomy in semi-natural colors. Diagnosis, surgical planning and radiotherapy targeting and monitoring may benefit from the study and interactive manipulation of such models. The value of such use in teaching and training in the anatomical sciences is anticipated to be high.

A distinct advantage of the composite generation methods used is the simplicity with which the composites are produced. In these composites, the final additive color assignments can be easily defined in terms of the intensity levels of various tissues within the component gray-tone images as well as by the colors (coefficiency values) these images have been assigned. In color composites, the gray-tone $T_1$ and $T_2$ tissue contrast patterns are translated into various color assignments that can be intuitively interpreted based on a basic knowledge of RGB color combinations. Because of this characteristic, the color composite method is readily applicable to MR images obtained using conventional pulse sequences.

The invention also includes a method of classifying the composite images based on their pixel signatures. The method may be implemented on the computer 16 with appropriate software, or be determined by hand calculations. For classification, a particular pixel in a region of interest on the composite image is identified. The composite color of the pixel is dissected to identify the color contributions proportion of each of the RGB channels, and also and the average intensity values for each image to produce the particular color. Such contributions may be easily determined. Commonly available software, such as Image pro Color (Media Cybernetics) allows for the automatic analysis of RGB contributions. For example, a pure bright yellow pixel would indicate equal contributions of green and red without any contribution of blue. Based upon these proportions, the proportional influence from each of the original monochrome images which make up the composite must be considered, this information being known from the color-coefficiency tables. This is merely the reverse calculation of that which is determined in producing the color coefficiency tables. For example, in the above yellow pixel wherein green and red have equal contributions with blue having none, if it was determined that the composite comprised of a $T_1$-weighted image assigned $G=100$ and a $T_2$-weighted image assigned $R=100$, it would be determined the tissues on $T_1$ and $T_2$ which had similar intensities in the original gray-tone images contributed to this pixel. The histogram plotting of the average intensity values could indicate that a possible tissue with this characteristic on both $T_1$ and $T_2$ was follicle. Typical classification are provided for each pulse sequence and composite color as indicated in the examples and Figures.

The invention has been described in an illustrative manner, and it is to be understood that the terminology which has been used is intended to be in the nature of words of description rather than of limitation.

Obviously, many modifications and variations of the present invention are possible in light of the above teachings. It is, therefore, to be understood that within the scope of the appended claims wherein reference numerals are merely for convenience and are not to be in any way limiting, the invention may be practiced otherwise than as specifically described.

What is claimed is:

1. A method of analyzing a single color composite image produced from a plurality of multiparameter magnetic resonance images, the method including the steps of:
   identifying a region of interest in the composite image,
   identifying the proportional color contributions of red, green and blue of the selected region of interest;
   analyzing the color coefficient values originally assigned to each independent image for the production of the color composite image and the average signal intensities of the regions of interest provided by each image;
   listing potential anatomical, physiological or pathological features associated with the analyzed region of interest based on the proportional influence from each color contribution and image which produced the composite.

2. A method as set forth in claim 1 further including identifying the average intensity values for each image of the composite image.

3. A method as set forth in claim 1 further including determining th eproportional color and intensity influences from each of the original images making up the composite image.

4. A method as set forth in claim 1 further including plotting average signal intensities of pixels within the region of interest for each orginal image.

5. A method as set forth in claim 1 further including producing coefficient values of the primary red, green and blue colors assigned to each image indicative of a different monochrome color for each image.

6. A method of analyzing a single color composite image produces from a plurality of multiparameter magnetic resoance images, the method including the steps of:
   identifying a region of interest in the composite image;
   identifying the proportional color contributions of predetrmined colors of the selected region of interest;
   analyzing color coefficient values originally assigned to each independent image making up the composite image; and
   listing potential anatomical, physiological or pathological features associated with the analyzed region of interest based on the proportional influence from each color contribution and image which produced the composite image.

7. A method as set forth in claim 6 further including identifying and analyzing the average signal intensities of the region of interest provided by each image of the composite image.

8. A method as set forth in claim 7 including identifying the proportional color contributions of red, green and blue of the selected region of interest.

* * * * *